US006229462B1

(12) United States Patent
Dike et al.

(10) Patent No.: US 6,229,462 B1
(45) Date of Patent: *May 8, 2001

(54) METHOD AND APPARATUS FOR REDUCING THE DISPARITY OF SET AND CLEAR BITS ON A SERIAL LINE

(75) Inventors: Charles E. Dike, Hillsoboro; Bradley A. Bloechel, Beaverton, both of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,023

(22) Filed: Mar. 30, 1999

(51) Int. Cl.$^7$ ................................................ H03M 13/00
(52) U.S. Cl. .............................................. 341/94; 340/347
(58) Field of Search .............................. 341/94, 106, 86, 341/95; 371/55; 340/347

(56) References Cited

U.S. PATENT DOCUMENTS

| 4,499,454 | * | 2/1985 | Shimada | 340/347 |
| 4,520,346 | * | 5/1985 | Shimada | 340/347 |
| 4,760,378 | * | 7/1988 | Iketani et al. | 340/347 |

* cited by examiner

Primary Examiner—Brian Young
Assistant Examiner—John B Nguyen
(74) Attorney, Agent, or Firm—Blakely, Sokoloff, Taylor & Zafman LLP

(57) ABSTRACT

A method and apparatus for minimizing a disparity of set and clear bits transmitted across a serial line is disclosed. The method operates by determining a line disparity by examining n-bit datawords that are transmitted. The method also determines a dataword disparity is determined for a dataword yet to be transmitted. The dataword yet to be transmitted is then inverted before transmission if the line disparity and the dataword disparity have the same sign.

19 Claims, 9 Drawing Sheets

Figure 1 - Prior Art

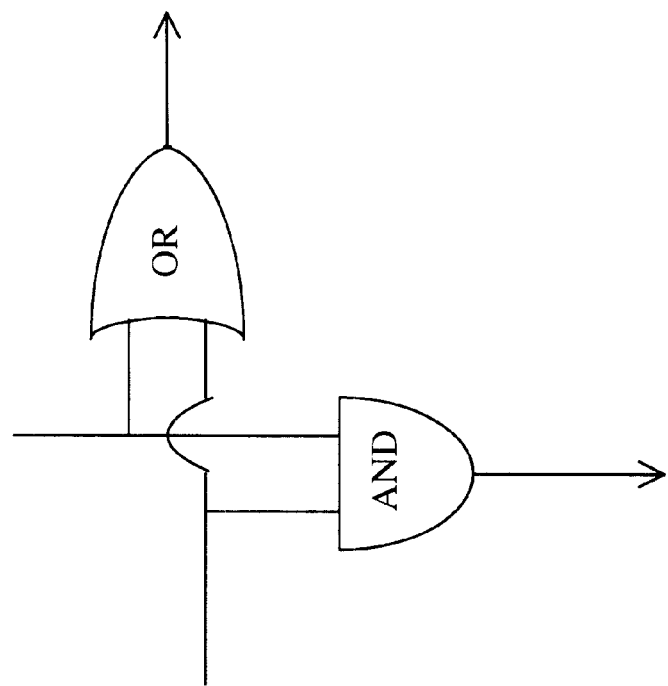
=
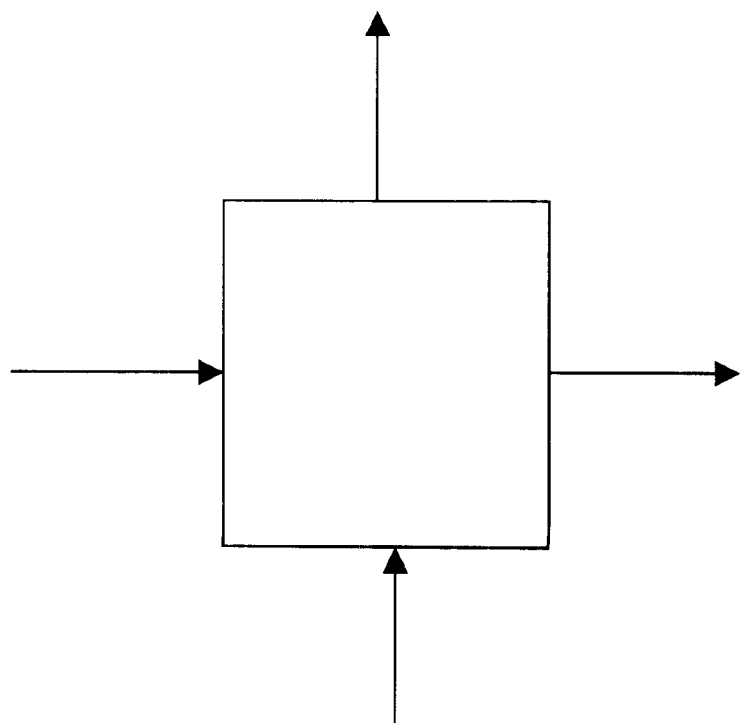
Figure 3b

METHOD AND APPARATUS FOR REDUCING THE DISPARITY OF SET AND CLEAR BITS ON A SERIAL LINE

FIELD OF THE INVENTION

The present invention relates to the field of digital communications. In particular the present invention discloses a circuit that minimizes the disparity of set and clear bits transmitted across a serial bit channel.

BACKGROUND OF THE INVENTION

A serial bit channel is an information channel that carries digital information as a sequential series of ones ("1") and zeros ("0"). Since the bits are transmitted sequentially, only one conductor is required to implement a serial bit channel. (However, most implementations use another conductor for ground/reference and may use additional conductors for flow control, timing, etc.)

One simple method of implementing a serial line is to designate a ground voltage value as a clear ("0") bit and a +5 voltage value as a set ("1") bit value. In such a system, a long series of set ("1") bits will cause the physical media of the serial channel to have a positive direct current (DC) bias. Similarly, a long series of clear ("0") bits will cause the serial channel to become biased towards ground. This biasing in either direction may eventually cause data interpretation errors.

To prevent such data interpretation errors, it would be desirable to limit the disparity between the number of set ("1") bits transmitted and the number of clear ("0") bits transmitted.

SUMMARY OF THE INVENTION

A method of minimizing a disparity of set and clear bits transmitted across a serial is disclosed. The method operates by determining a line disparity by examining a first n bit dataword to be transmitted on said serial line, the line disparity specifying a disparity between set bits and clear bits. The method further examines a second n bit dataword to be transmitted to determine a dataword disparity of the second n bit dataword, the data word disparity specifying a disparity between set bits and clear bits in said dataword. The method further generates a third n bit dataword by assigning a complement of the second n bit dataword if the line disparity and said word disparity have a same sign, else assigning the second n bit data word to the third n bit dataword. The method then transmits the third n bit dataword.

BRIEF DESCRIPTION OF THE DRAWINGS

The objects, features and advantages of the present invention will be apparent to one skilled in the art, in view of the following detailed description in which:

FIG. 3b illustrates one embodiment of a circuit within each logic cell of FIG. 3a.

FIG. 6b illustrates one embodiment of a disparity comparison circuit within each logic cell of FIG. 6a.

DETAILED DESCRIPTION OF THE PREFERRED EMBODIMENT

A method and apparatus for minimizing the disparity of set and clear bits on a serial line is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to an embodiment that operates on 18 bit data words. However, the same techniques can easily be applied to systems that use larger or smaller dataword sizes.

Serial Line Bit Disparity Background

To prevent biasing on a serial line, the number of set ("1") bits and clear ("0") bits transmitted across the serial line should be approximately equal. For example, in a system where a set ("1") bit is represented by a +5 Volt signal and a clear ("0") bit is represented by a ground signal, a long series of set ("1") bits will cause the serial channel to have a positive direct current (DC) bias. Similarly, a long series of clear ("0") bits will cause the serial channel to become biased towards ground. This biasing in either direction may eventually cause data interpretation errors. To prevent such data interpretation errors, it would be desirable to minimized the disparity between the number of set ("1") bits transmitted and the number of clear ("0") bits transmitted.

Figure 1:
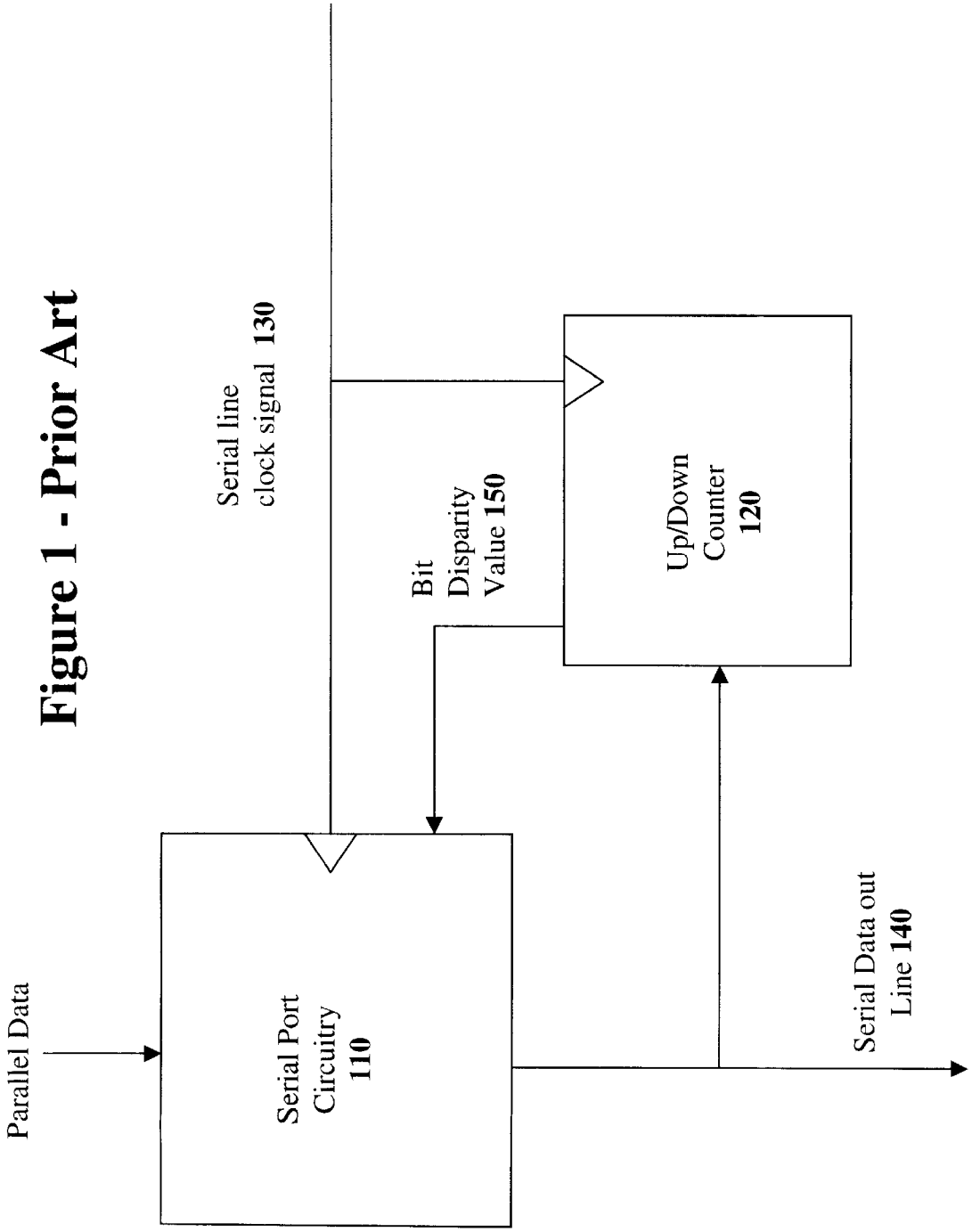
FIG. 1 illustrates a prior art system for determining a disparity of set and clear bits sent out on a serial link.

FIG. 1 illustrates a block diagram that describes one method of minimizing bit disparity. In the system of FIG. 1, the output from serial port circuitry 110 is passed to an up/down counter 120. The up/down counter 120 is clocked with the same clock signal used to clock the serial port circuitry output. Each time the serial port circuitry 110 transmits a bit out the serial data output line 140, the up/down counter 120 will increase or decrease the counter value depending on if the bit is set ("1") or clear ("0"). Thus, the up/down counter 120 maintains a link disparity value.

The up/down counter 120 provides the link disparity value 150 to the serial port circuitry 110. The serial port circuitry 110 may use the link disparity value 150 to adjust the output in order to reduce bit disparity on the serial output line 140.

The circuitry of FIG. 1 is not simple to design and manufacture. For example, the up/down counter 120 must operate at the serial line clock signal speed that may be much greater than the system clock speed. It is difficult to use the output of the up/down counter 120 since the serial circuit would need to examine the output on the last bit of a word and decide how the next word would be handled during that single clock cycle. Thus, it would be desirable to have serial line bit disparity minimization circuitry that does not need to run at the serial line clock signal speed.

An Improved Serial Line Bit Disparity Minimization Circuitry

Figure 2:
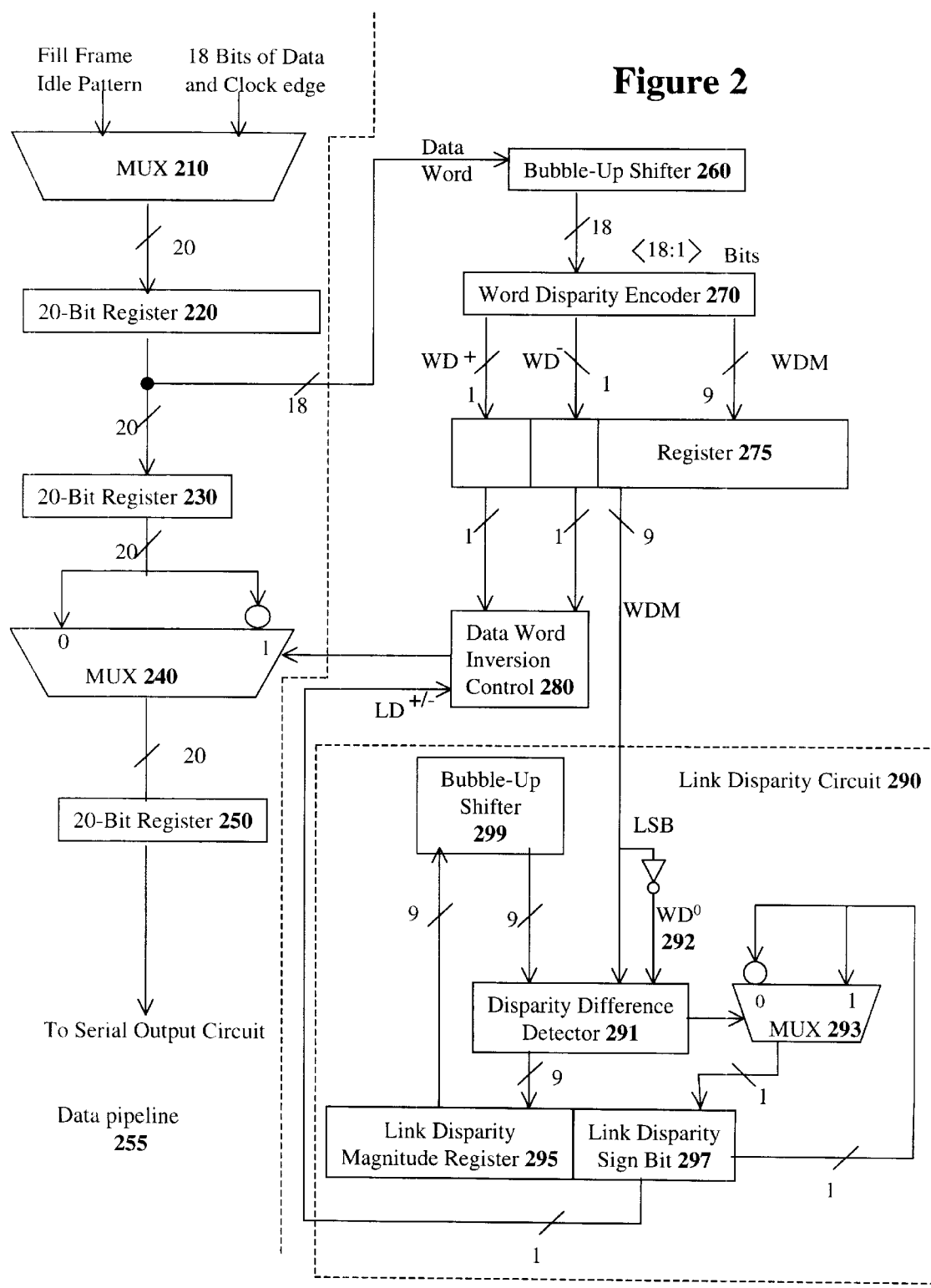
FIG. 2 illustrates a first embodiment of a parallel to serial circuit that nimizes link disparity.

The present invention introduces a new circuit for minimizing the bit disparity on a serial bit channel. FIG. 2 illustrates a block diagram of one embodiment of a bit disparity minimization circuit for parallel to serial bit streams.

SUMMARY OF OPERATION

The bit disparity minimization circuit of FIG. 2 examines the parallel versions of datawords that are just about to be transmitted out to determine a link disparity and examines the parallel versions of datawords yet to be transmitted to determine a current dataword parity. Depending on the current state of the link disparity and the current dataword disparity, the bit disparity minimization circuit of FIG. 2 may invert the current dataword to minimize the bit disparity. Specifically, if both the link disparity and dataword disparity have the same sign (positive or negative) then the bit disparity minimization circuit of FIG. 2 will invert the current dataword before transmission.

DETAILED OPERATION

Referring to FIG. 2, multiplexor 210 receives input data that is either an idle pattern for filling frames or is a data word with an accompanying clock edge. In the embodiment of FIG. 2, each dataword is eighteen bits long and the clock edge is two bits. The clock edge comprises a pair of one set ("1") bit and one clear ("0") bit. One of the two possible clock edge settings is "01" and the other is "10". One of those two settings is chosen to indicate a normal (noninverted) dataword and the other indicates an inverted dataword.

The dataword and clock edge (or the fill pattern) from the multiplexor 210 is passed to a 20-bit storage register 220. Eighteen of bits, the 18-bit data portion, are passed to a bubble-up shifter 260 in order to move all of the set ("1") bits to the least significant bit positions for a simplified data word bit disparity calculation.

Figure 3A:
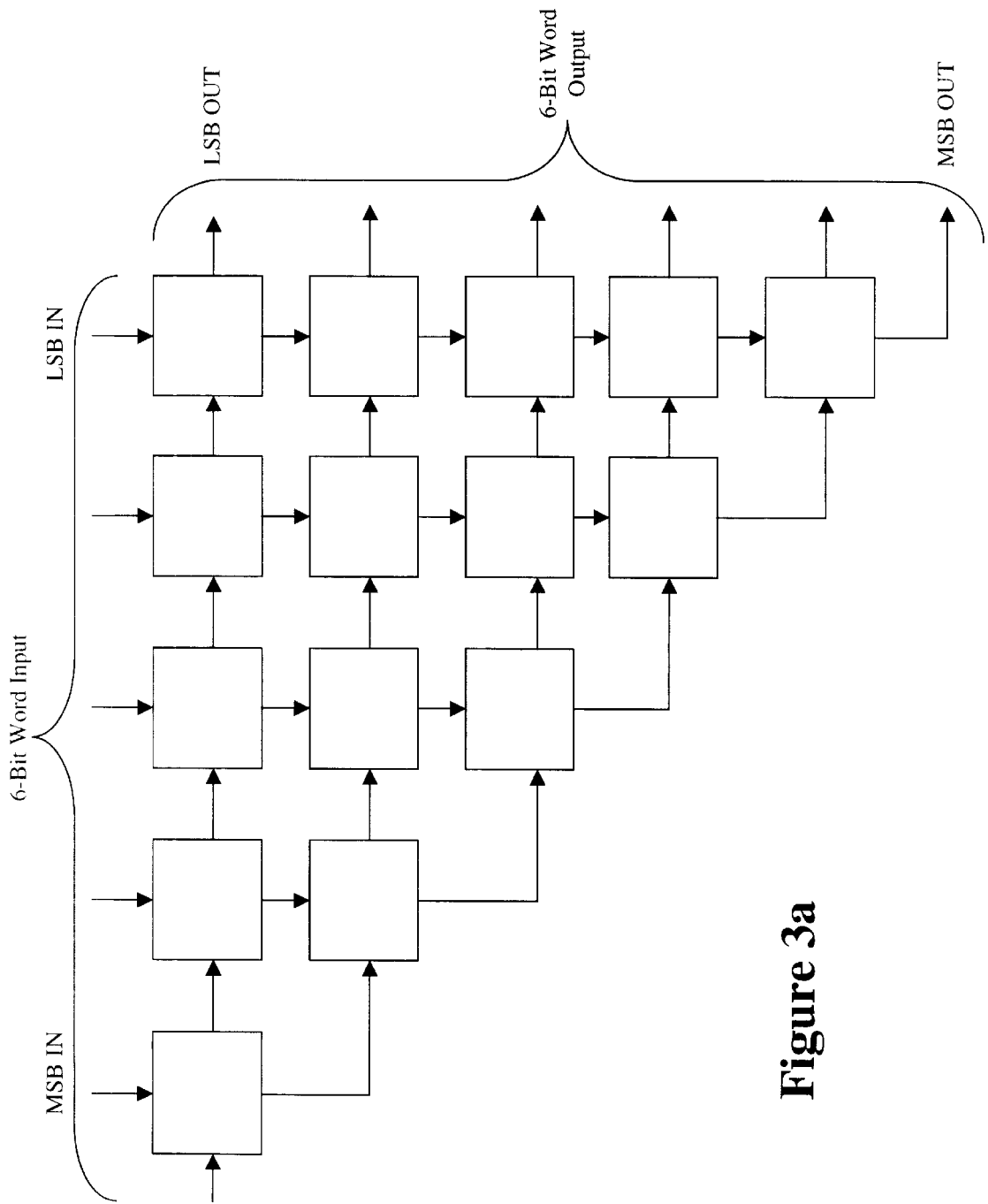
FIG. 3a illustrates block diagram of one embodiment of a bubble-up circuit that moves all the set bits of a bit vector into the least significant bit positions of the bit vector.

FIG. 3a illustrates a block diagram of a simple six-bit bubble-up shifter circuit 300. The bubble-up shifter circuit 300 is a systolic array of individual logic cells. FIG. 3b illustrates the content of each logic cell in FIG. 3a. The operation of the systolic array described with reference to FIGS. 3a and 3b is to output a set ("1") in the least significant output bit if at least one bit in the input word is set ("1"), output a set ("1") in the second least significant output bit if at least two bits in the input word are set ("1"), output a set ("1") in the third least significant output bit if at least three bits in the input word are set ("1"), and so on. For example, if an input of "101010" is placed onto the systolic array of FIG. 3a and FIG. 3b then the array will output "000111".

Referring back to FIG. 2, the bubble-up shifter 260 passes the bubble-up shifted word to a dataword disparity encoder 270. The dataword disparity encoder 270 encodes the bit disparity of the dataword into bit disparity sign that indicates positive, negative, or zero bit disparity and word disparity magnitude (WDM) that specifies an absolute magnitude of the current dataword's bit disparity. In the embodiment of FIG. 2, the dataword bit disparity sign is encoded by setting one of three output bits that indicate if the dataword disparity is positive (indicated by the WD$^+$output line), negative (indicated by a WD$^{31}$ output line), or zero (indicated by the WD$^0$ output line).

Figure 4:
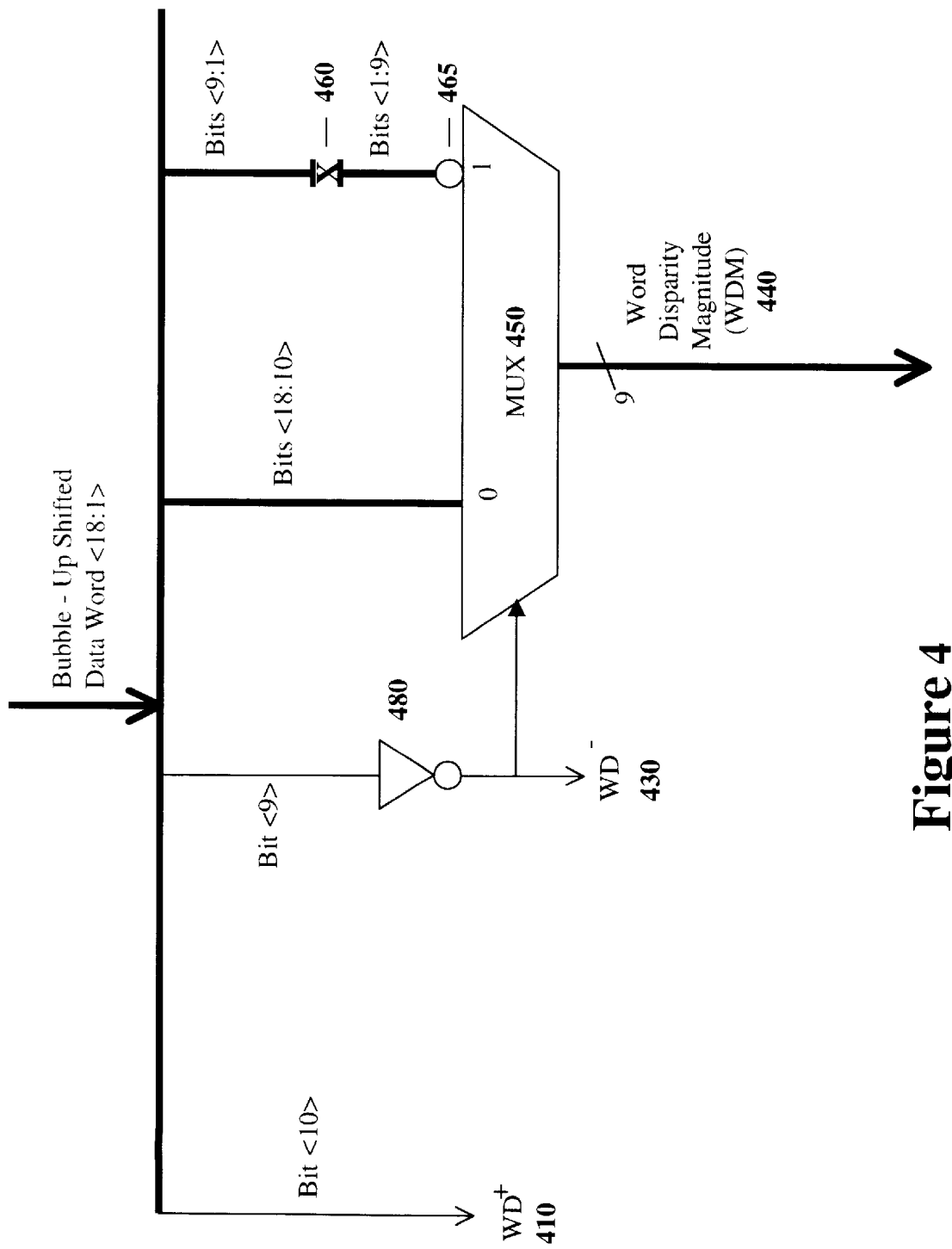
FIG. 4 illustrates one embodiment of a word disparity encoder wherein the sign of the word disparity (positive, negative, or zero) and magnitude of the word disparity is output.

FIG. 4 illustrates one embodiment of a dataword disparity encoder circuit 270. Referring to FIG. 4, the word disparity positive (WD$^+$) output line 410 indicating more set ("1") bits than clear bits ("0") will be set if the tenth least significant bit is set since that bit will only be set if there are at least ten set bits in the current dataword. Similarly, the word disparity negative (WD$^-$) output line 430 indicating more set ("1") bits than clear bits ("0") will be set if the ninth least significant bit is clear ("0") since that bit will only be clear if there are at least ten clear bits in the current dataword.

The word disparity magnitude 440 will be set using either bits <18:10> or bits <9:1> of the bubble-up shifted dataword. Specifically, the word disparity negative (WD$^-$) output line 430 controls multiplexor 450 such that bits <18:10> are selected for the word disparity magnitude if the word disparity is not negative and inverted bits <1:9> are selected if the word disparity is negative. Thus, when the bit disparity is not negative, bits <18:10> will indicate the number of set ("1") bits more than an equal number of set and reset bits (nine bits). When disparity is negative, the zeros of bits <9:1> are made into ones and placed into the least significant bit positions by reversing the bit positions into <1:9> at line reversing section 460.

When bit <9> is set, the multiplexor 450 selects bits <18:10> in the word disparity magnitude. When bit <9> is set and bit <10> is clear, this state indicates that there are an equal number of set ("1") bits and clear bits ("0"), a condition referred to as word disparity neutral. Referring to FIG. 2, a word disparity neutral (WD$^0$) output line 292 indicating equal numbers of set ("1") bits and clear bits ("0") is generated using the least significant bit of the word disparity magnitude. Specifically, the least significant bit of the word disparity magnitude is inverted to generate a bit that is set when there is no bit disparity and clear when there is a bit disparity.

Referring again to FIG. 2, the dataword disparity encoder 270 outputs the disparity sign and word disparity magnitude into register 275. At the same time with the same clock signal, the data value from 20-bit register 220 is clocked into 20-bit register 230 along the data pipeline 255. The data value in 20-bit register 230 will next pass through multiplexor 240 either straight through or inverted under the control of dataword inversion control circuit 280.

The dataword inversion control circuit 280 operates by inverting the current dataword before transmission if the bit disparity of the current dataword has the same bit disparity sign (positive or negative) as the current link disparity. By inverting the current dataword if its bit disparity is the same sign as the link disparity, the present invention will ensure that the link bit disparity never exceeds the total number bits in a dataword. For example, in the embodiment of FIG. 2 where the dataword is eighteen bits, the link bit disparity (LD$^{+/-}$) will never exceed eighteen.

Figure 5:
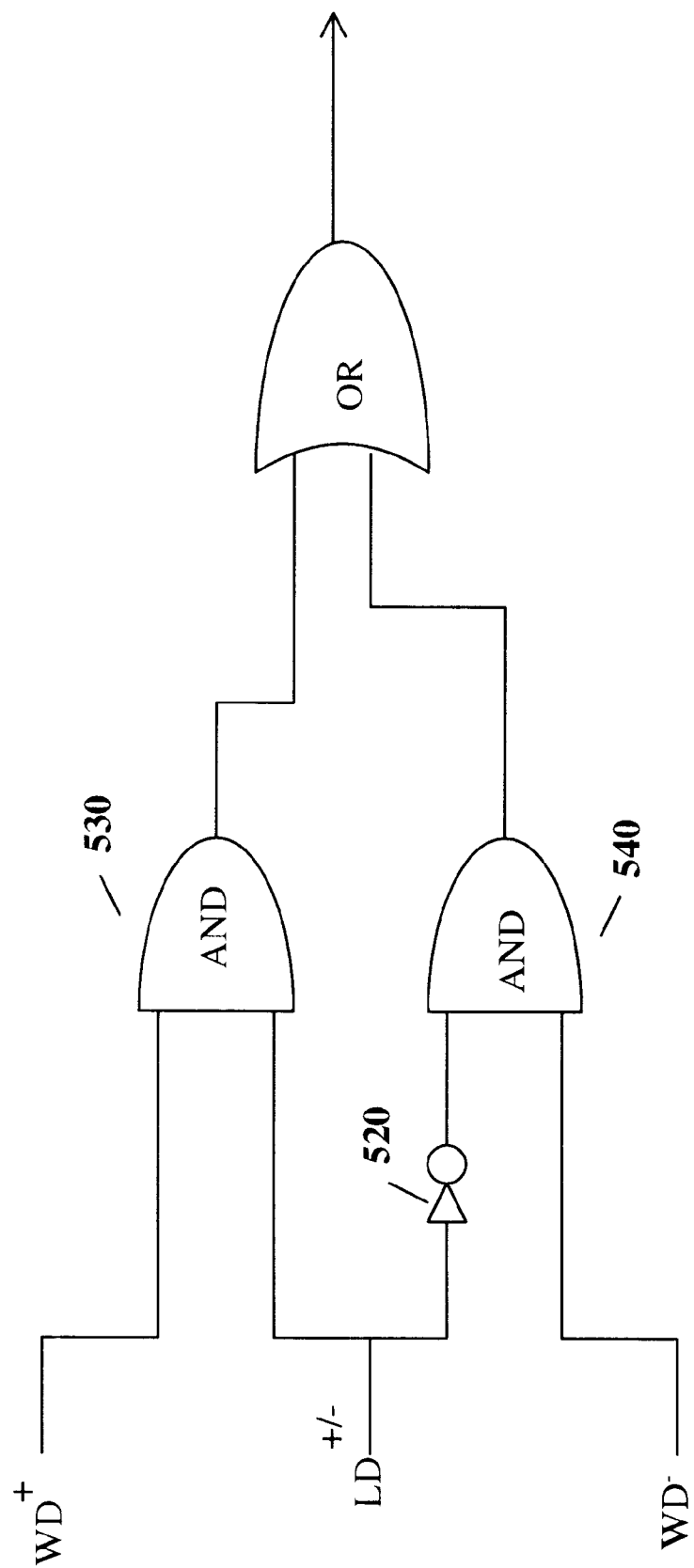
FIG. 5 illustrates the data word inversion control logic that determines if the next dataword to be transmitted should be inverted.

FIG. 5 illustrates one possible embodiment of the dataword inversion control circuit. Referring to FIG. 5, the dataword inversion control circuit uses the word disparity positive (WD$^+$) line, word disparity negative (WD$^-$) line, and a link disparity (positive or negative) line (LD$^{+/-}$) as inputs. The word disparity positive (WD$^+$) line and word disparity negative (WD$^-$) line are created by the word disparity encoder 270 of FIG. 2 and passed to the dataword inversion control circuit 280 through register 275. The link disparity line is received from a link disparity circuit 290 that determines the current bit disparity of the serial link. The details of the link disparity circuit 290 will be described later.

Referring back to FIG. 5, if both the word disparity positive (WD$^+$) line is set and the link disparity line (LD$^{+/-}$) indicates positive disparity, then the word inversion control line 590 will be set to indicate that the dataword should be inverted. Similarly, if both the word disparity negative line (WD⁻) and the link disparity line (LD⁺/⁻) indicate negative disparity, then the word inversion control line 590 will be set to indicate that the dataword should be inverted. In both cases, the inversion is performed to prevent the link disparity from increasing its absolute value.

Referring again to FIG. 2, the link disparity circuit 290 is responsible for determining the current bit disparity on the link. The output from the link disparity circuit 290 is the link disparity line (LD⁺/⁻) 289 that specifies if there have been more set ("1") bits transmitted than clear ("0") bits. The link disparity circuit 290 performs this task by combining together the bit disparity of each dataword that is transmitted in order to maintain a link disparity magnitude value 295 and a link disparity sign bit 297.

Referring to the link disparity circuit 290, the nine-bit link disparity magnitude value 295 is initially set to zero ("000000000") to indicate a zero disparity on the serial link. Similarly, the link disparity sign bit 297 is set to some initial value such as positive ("1"). However, the initial condition of the link disparity sign bit 297 actually does not matter. When a new dataword is to be transmitted, a disparity difference detector 291 logically updates the link disparity magnitude value 295 and a link disparity sign bit 297 using the word disparity magnitude 277 and the word disparity neutral (WD⁰) line 279 of the dataword to be transmitted.

The link disparity magnitude value 295 contains the absolute value of the current link disparity. The link disparity circuit 290 updates the link disparity magnitude value 295 by subtracting the word disparity magnitude 277 from the current link disparity magnitude value 295. The disparity difference detector 291 of the link disparity circuit 290 performs the subtraction. The disparity difference detector 291 of the link disparity circuit 290 updates the link disparity sign bit 297 by inverting the link disparity sign bit 297 if the word disparity magnitude is greater than the link disparity magnitude 295 and the word disparity neutral (WD⁰) line 279 does not indicate a zero disparity.

Figure 6A:
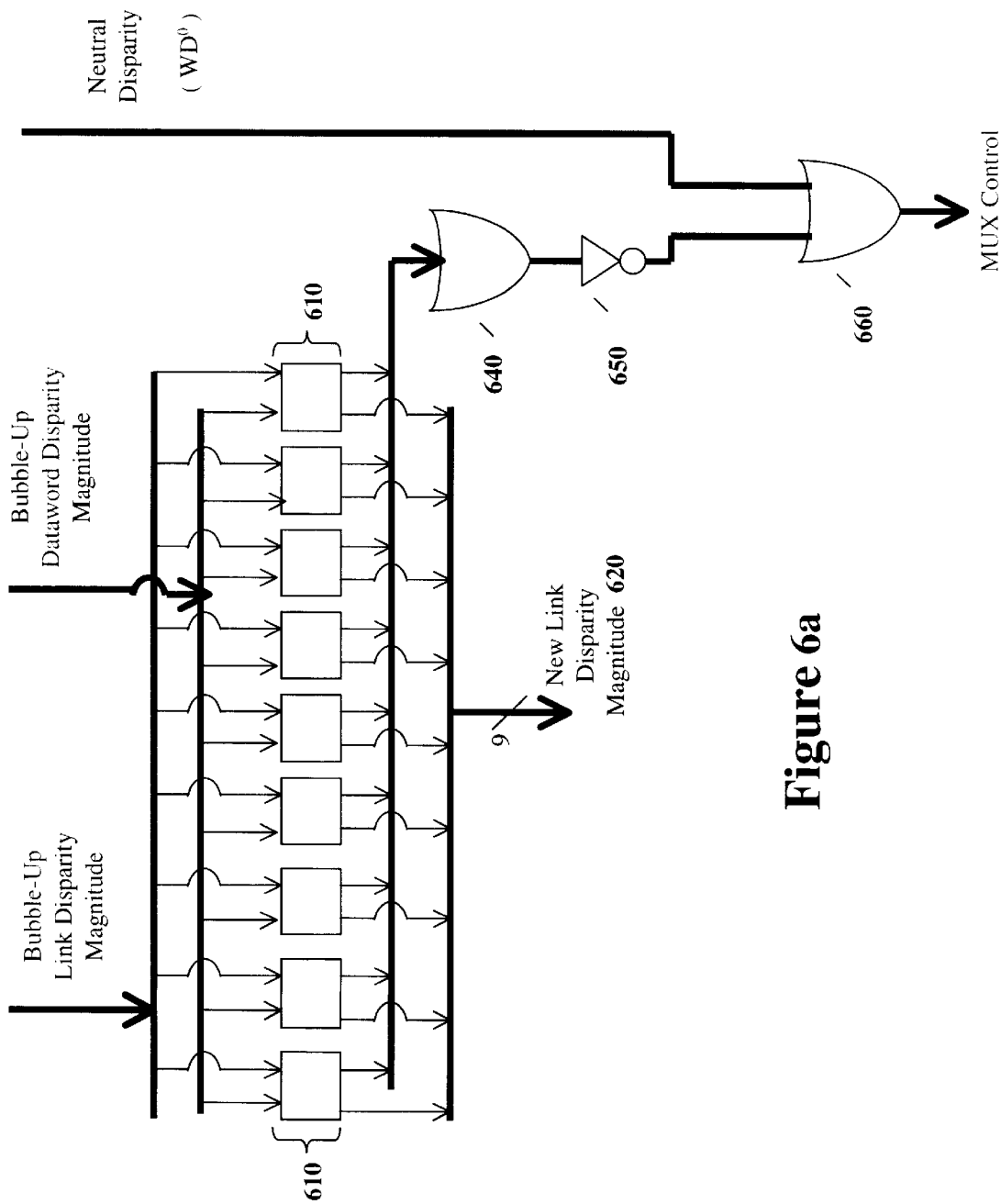
FIG. 6a illustrates a block diagram of one embodiment of a disparity difference detector.
Figure 6B:
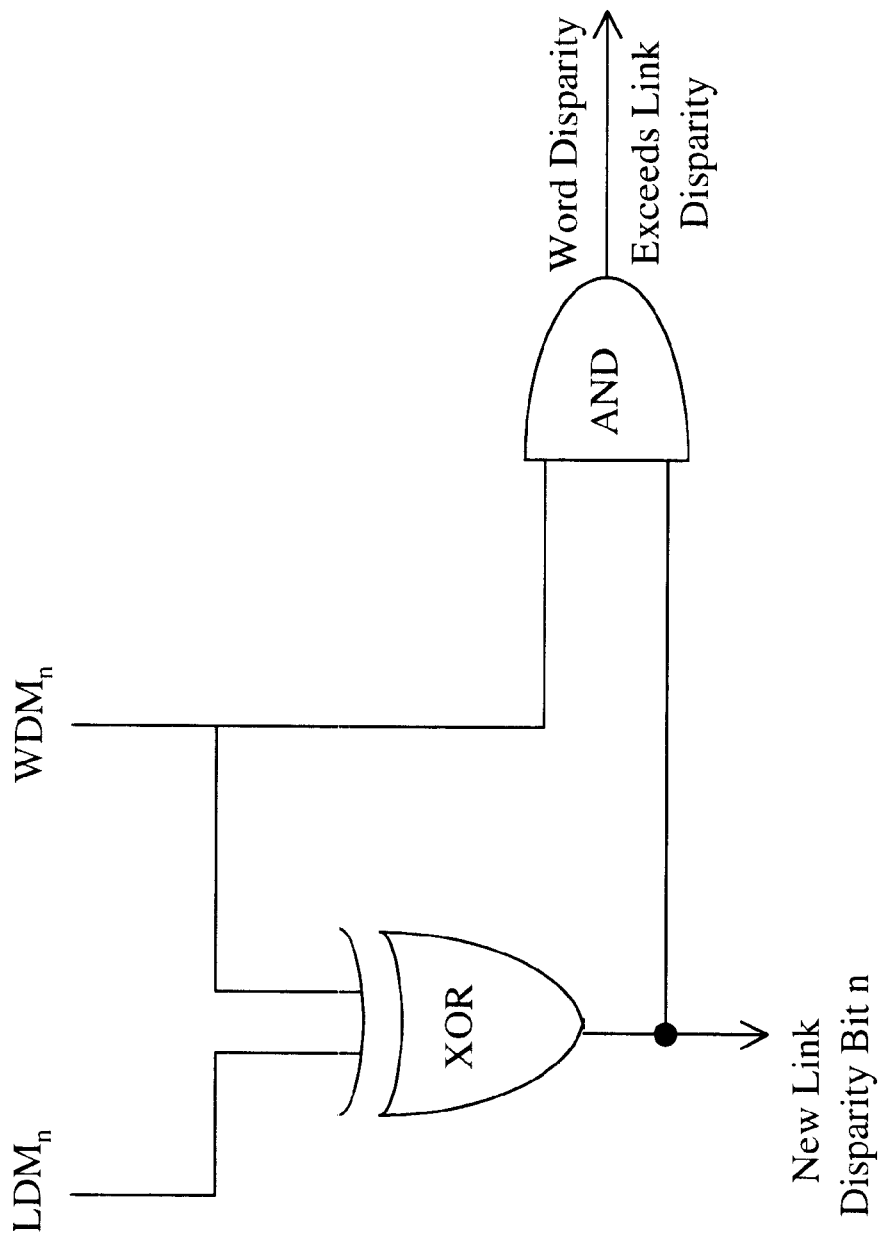

Referring to FIG. 2, the disparity difference detector 291 is supplied with the bubble-up shifted word disparity magnitude of the current dataword from register 275 and a bubble-up shifted link disparity magnitude from link disparity magnitude register 295 passed through bubble-up shifter 299. FIGS. 6a and 6b illustrate how the disparity difference detector 291 operates. Referring to FIG. 6a, the disparity difference detector performs a bit by bit comparison of the two magnitude values with a set of logic cells 610. FIG. 6b illustrates the comparison performed by each logic cell 610.

Referring to FIG. 6b, each corresponding bit from the link disparity magnitude is subtracted from the word disparity magnitude by performing an exclusive-OR (XOR) of the bits to produce a new set of link disparity bits 620 that will comprise the next link disparity magnitude value. The sign of the link disparity is set by inverting the current link disparity sign bit 297 unless the current word disparity is zero (the word disparity neutral (WD⁰) line 279 is asserted) or the current link disparity magnitude is greater than the dataword disparity magnitude (WDM). The inversion is controlled by logic within the disparity difference detector 291. Specifically, the AND gate of FIG. 6b and the OR gate of FIG. 6a determine if the link disparity is greater than the word disparity by determining if there is any set bit in the link disparity magnitude where there is no word disparity magnitude.

Referring back to FIG. 2, the dataword inversion control circuit 280 uses the dataword and link disparity signs to control multiplexor 240 such that the dataword in register 230 is inverted if the dataword and link disparity signs are the same. The inverted or non-inverted dataword is then moved into register 250 where it will then be processed by the serial output circuitry that outputs a serial bit stream from a parallel input. It should be noted that the two clock edge bits will be inverted such that the two clock edge bits can be used by the receiver at the other end of the serial link to determine if the dataword was inverted before transmission.

AN ALTERNATE EMBODIMENT

Figure 7:
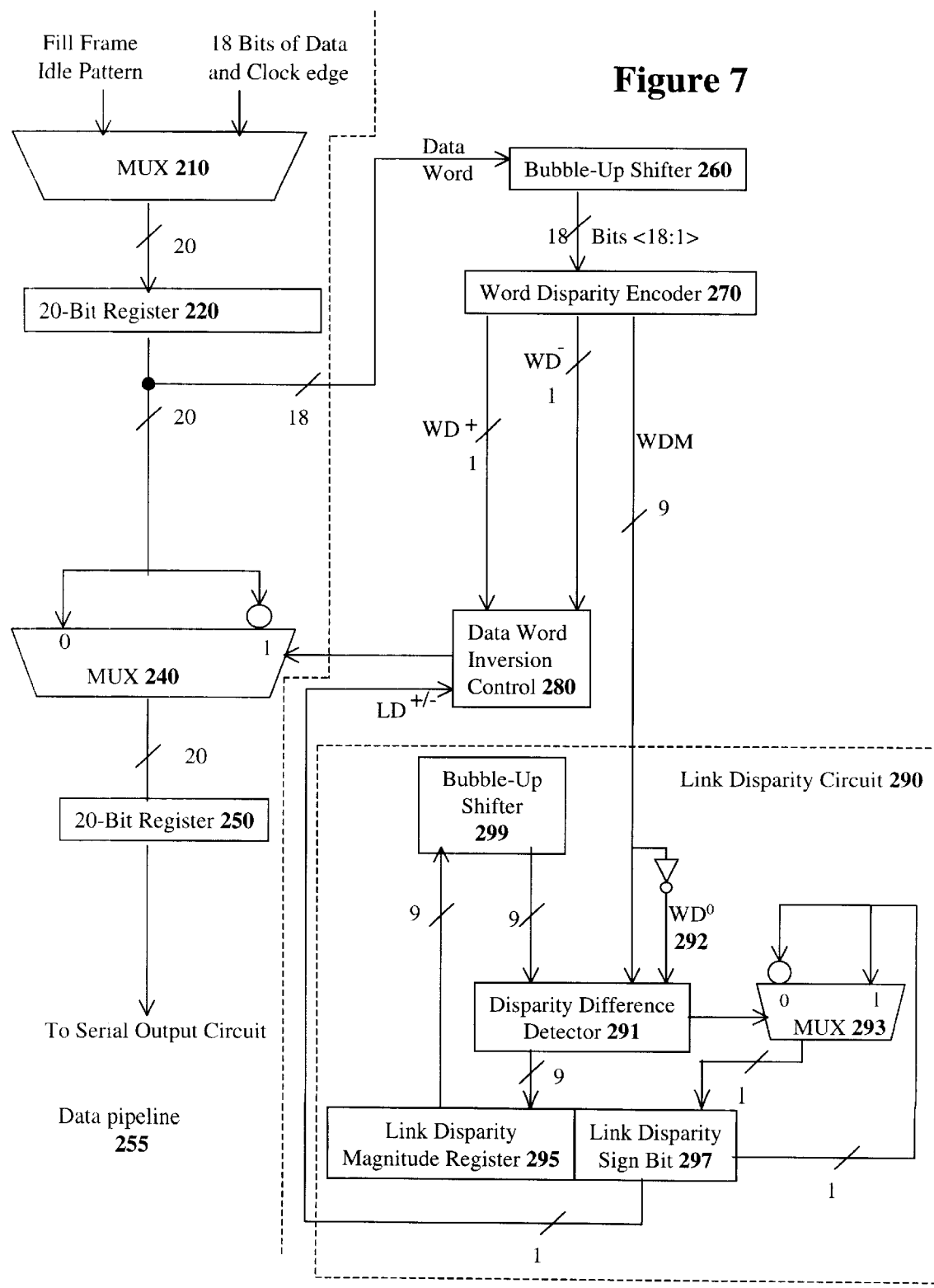
FIG. 7 illustrates a second embodiment of a parallel to serial circuit that minimizes link disparity.

FIG. 7 illustrates an alternate embodiment of the parallel to serial circuit that minimizes link disparity. In the embodiment of FIG. 7, the pipeline has been shortened by removing the 20-bit register 230 and the 12-bit register 275 from FIG. 2. The shortened pipeline outputs the data with lower latency by removing a pipeline stage. However, fast logic must be used to implement the embodiment of FIG. 2 due to the increased propagation delay caused by the longer data paths.

The foregoing has described a parallel to serial circuit that minimizes link disparity. It is contemplated that changes and modifications may be made by one of ordinary skill in the art, to the materials and arrangements of elements of the present invention without departing from the scope of the invention.

We claim:

1. A method of reducing a disparity of set and clear bits transmitted across a serial line, said method comprising:

determining a line disparity by examining a first n bit dataword to be transmitted on said serial line, said line disparity specifying a disparity between set bits and clear bits;

examining a second n bit dataword to be transmitted to determine a dataword disparity of said second n bit dataword, said data word disparity specifying a disparity between set bits and clear bits in said dataword;

generating a third n bit dataword by assigning a complement of said second n bit dataword if said line disparity and said word disparity have a same sign, else assigning said second n bit data word; and transmitting said third n bit dataword.

2. The method as claimed in claim 1, said method further comprising:

updating a line disparity magnitude by subtracting a dataword disparity of said third n bit dataword from said line disparity.

3. The method as claimed in claim 2 wherein said subtracting is performed by exclusive-ORing a bubble-up shifted dataword disparity magnitude with a bubble-up shifted line disparity magnitude.

4. The method as claimed in claim 2, said method further comprising:

updating said line disparity sign by inverting said line disparity sign unless a dataword disparity sign is zero or said line disparity magnitude is greater than said word disparity magnitude.

5. The method as claimed in claim 1 wherein examining a second n bit dataword to be transmitted to determine a dataword disparity of said second n-bit dataword comprises:

bubble-up shifting said second n bit dataword to generate a fourth n-bit dataword; and examining at least one bit in the middle of said fourth n-bit dataword.

6. The method as claimed in claim 5 wherein at least one bit in the middle of said fourth n-bit dataword comprises designating said second n-bit dataword as having a positive disparity if a least significant bit in an upper half of said fourth n-bit dataword is set.

7. The method as claimed in claim 5 wherein at least one bit in the middle of said fourth n-bit dataword comprises designating said second n-bit dataword as having a negative disparity if a most significant bit in an lower half of said fourth n-bit dataword is clear.

8. An bit disparity reduction circuit, said circuit comprising:

a link disparity circuit, said link disparity circuit determining a link disparity by examining a disparity of datawords to be transmitted before said datawords are transmitted;

a dataword disparity circuit for determining a dataword disparity for a next dataword to be transmitted; and an inverter circuit, said inverter circuit inverting said next dataword to be transmitted if said link disparity and said dataword disparity have a same sign.

9. The circuit as claimed in claim 8 wherein said link disparity circuit updates said link disparity by subtracting said dataword disparity from said link disparity.

10. The circuit as claimed in claim 9 wherein said subtracting is performed by exclusive-ORing a bubble-up shifted dataword disparity magnitude with a bubble-up shifted line disparity magnitude.

11. The circuit as claimed in claim 9 wherein said link disparity circuit updates a line disparity sign by inverting said line disparity sign unless a dataword disparity sign is zero or said line disparity magnitude is greater than said word disparity magnitude.

12. The circuit as claimed in claim 8 wherein said dataword disparity circuit comprises:

a bubble-up shifter for shifting all set bits in said next dataword to be transmitted into least significant bits of a shifted dataword; and a dataword disparity encoder that examines at least one bit in the middle of said shifted dataword.

13. The circuit as claimed in claim 12 wherein said dataword disparity encoder designates said next dataword as having a positive disparity if a least significant bit in an upper half of said shifted dataword is set.

14. The circuit as claimed in claim 12 wherein said dataword disparity encoder designates said next dataword as having a negative disparity if a most significant bit in an upper half of said shifted dataword is clear.

15. The circuit as claimed in claim 12 wherein said dataword disparity encoder designates said next dataword as having a zero disparity if a least significant bit in an upper half of said shifted dataword is clear and a most significant bit in an upper half of said shifted dataword is set.

16. A serial data circuit for transmitting data on a serial link, said circuit comprising:

a dataword disparity circuit for determining a next dataword bit disparity of a next dataword to be transmitted; and a link disparity circuit, said link disparity circuit determining a current link disparity of said serial link by combining a current dataword bit disparity of a current dataword being transmitted with a former link disparity;

an inverter circuit, said inverter circuit inverting said next dataword to be transmitted if said current link disparity and said next dataword bit disparity have a same sign.

17. The serial data circuit as claimed in claim 16 wherein said next dataword bit disparity of said next dataword to be transmitted becomes said current dataword bit disparity of said current dataword being transmitted.

18. The serial data circuit as claimed in claim 16 wherein said link disparity circuit updates a line disparity sign by inverting said line disparity sign unless a dataword disparity sign is zero or said line disparity magnitude is greater than said word disparity magnitude.

19. The serial circuit as claimed in claim 16 wherein said dataword disparity circuit comprises:

a bubble-up shifter for shifting all set bits in said next dataword to be transmitted into least significant bits of a shifted dataword; and a dataword disparity encoder that examines at least one bit in the middle of said shifted dataword.

* * * * *

UNITED STATES PATENT AND TRADEMARK OFFICE
CERTIFICATE OF CORRECTION

PATENT NO. : 6,229,462 B1  Page 1 of 1
DATED : May 8, 2001
INVENTOR(S) : Dike et al.

It is certified that error appears in the above-identified patent and that said Letters Patent is hereby corrected as shown below:

Title page,
Item [75], delete "Hillsoboro" and insert -- Hillsboro --.

Column 1,
Line 57, delete " nimizes" and insert -- minimizes --.

Signed and Sealed this

Seventh Day of May, 2002

Attest:

Attesting Officer

JAMES E. ROGAN
Director of the United States Patent and Trademark Office